United States Patent [19]
Rangasayee et al.

[11] Patent Number: 5,638,008
[45] Date of Patent: Jun. 10, 1997

[54] METHOD AND APPARATUS FOR GENERATING AN ASYNCHRONOUSLY CLOCKED SIGNAL IN A SYNCHRONOUSLY CLOCKED PROGRAMMABLE DEVICE

[75] Inventors: Krishna Rangasayee, Sunnyvale, Calif.; Philippe Larcher, Les Ulis Cedex, France

[73] Assignee: Cypress Semiconductor Corp., San Jose, Calif.

[21] Appl. No.: 550,165

[22] Filed: Oct. 30, 1995

[51] Int. Cl.$^6$ .............................................. H03K 19/177
[52] U.S. Cl. ........................... 326/39; 326/40; 326/46; 326/93
[58] Field of Search ............................ 326/39, 41, 46, 326/93, 96

[56] References Cited

U.S. PATENT DOCUMENTS

| | | | |
|---|---|---|---|
| 4,912,342 | 3/1990 | Wong et al. | 326/41 X |
| 5,231,312 | 7/1993 | Gongwer et al. | 326/41 X |
| 5,254,886 | 10/1993 | El-Ayat et al. | 326/41 |
| 5,258,668 | 11/1993 | Cliff et al. | 326/41 |
| 5,450,608 | 9/1995 | Steele | 326/39 X |

OTHER PUBLICATIONS

Cypress Semiconductor Corporation *Programmable Logic Data Book*, "CY7C340 EPLD Family: Multiple Array Matrix High-Density EPLD's"; pp. 3-1 to 3-5; Jul., 1994.

Cypress Semiconductor Corporation *Programmable Logic Data Book*, "CY7C341 CYC341B: 192-Macrocell MAX® EPLD's"; pp. 3-7 to 3-9; Jul., 1994.

Cypress Semiconductor Corporation *Programmable Logic Data Book*, "pASIC380 Family: Very High Speed CMOS FPGA's"; pp. 4-1 to 4-7; Jul., 1994.

FLASH370™ Preliminary CPLD Family: High-Density Flash CPLDs, *Cypress Semiconductor Corp Databook*, 1992, pp. 3-92 to 3-98.

*Primary Examiner*—David R. Hudspeth
*Attorney, Agent, or Firm*—Blakely, Sokoloff, Taylor & Zafman LLP

[57] ABSTRACT

A method and apparatus for generating an asynchronously clocked signal in a synchronously clocked programmable device is described. A programmable logic device having synchronously clocked or product term clocked registers receives an input signal and an event signal. The input signal and the event signal can be any externally or internally generated signals. The event signal signifies the occurrence of a particular event by transitioning from one signal state to another. The input signal is asynchronously clocked through the synchronously clocked PLD without utilizing the synchronously clocked or product term clocked registers. The input signal is asynchronously clocked in response to an edge transition of the event signal. The edge transition of the event signal being either a failing edge or a rising edge.

22 Claims, 11 Drawing Sheets

METHOD AND APPARATUS FOR GENERATING AN ASYNCHRONOUSLY CLOCKED SIGNAL IN A SYNCHRONOUSLY CLOCKED PROGRAMMABLE DEVICE

BACKGROUND OF THE INVENTION

1. Field of the Invention

The present invention relates to programmable logic devices. More particularly, the present invention relates to asynchronously clocking a signal within a synchronously clocked programmable device.

2. Description of the Related Art

Programmable logic devices (PLDs) are popular general purpose logic devices. PLDs generally include an AND array, an OR array and an I/O macrocell. The AND array comprises a plurality of logical AND gates and generates a large number of output signals called AND terms. The AND terms are received by the OR array which comprises a plurality of OR gates. The OR array generates a number of output signals, called product terms, by ORing selected AND terms together. The product terms generated by the OR array are then received by the I/O macrocell which comprises a number of circuit elements including clocked registers. The I/O macrocell of most PLDs outputs signals from the PLD and also feeds output signals back into the AND array for further use.

Many families of programmable logic devices such as PLD, CPLD, FPGA and ASIC devices are synchronously clocked devices. That is, these families of devices have dedicated pins which receive a clock signal for use within the programmable logic device. For example, within a particular family of synchronous programmable logic devices such as the FLASH370™ CPLD family provided by Cypress Semiconductor Corporation, clock input signals from dedicated clock/input pins are routed to synchronously clocked programmable registers within an I/O Macrocell. The programmable registers can only be clocked by the dedicated clock inputs.

There does not currently exist, however, a method or apparatus in the architecture of a synchronously clocked programmable device having dedicated system clocks, such as the FLASH370™ family, where a signal can be asynchronously clocked without utilizing a register element in an I/O macrocell. This architecture restricts the ability of a designer to use signals other than the dedicated system clocks as clock signals. Additionally, this limits the overall number of clocks available to the designer to the number of dedicated clock input pins.

Other families of PLDs can accommodate asynchronous (or product term) clocking. In these devices, a particular signal generated by the OR array can be utilized, in addition to the dedicated system clocks, to clock a signal through one of the clocked register elements in an I/O macrocell. This function is termed asynchronous clocking because a clock signal other than a dedicated system clock is utilized to clock the synchronously clocked register elements. Alternatively, this function is termed product term clocking because the synchronously clocked register can be "clocked" by a product term signal generated by the AND and OR arrays. In these PLD architectures, the asynchronously clocked signal is clocked through the register element in the I/O macrocell. In general, architectures accommodating product term clocks are inherently slower in operation and are more prone to clock skew and metastability issues in comparison with PLDs having dedicated system clocks.

There does not currently exist, however, a method or apparatus in the architecture of a synchronously clocked programmable which accommodates product term clocking, where a signal can be asynchronously clocked without utilizing a register element in an I/O macrocell.

Therefore, a need exists for utilizing internally or externally generated signals, other than dedicated system clocks, to asynchronously clock signals through a synchronously clocked programmable device without utilizing register elements in the I/O macrocells. Additionally, a need exists for providing a software means for interconnecting programmable logic in a synchronously programmable device having no hardware capability to generate an asynchronous signal, such that an asynchronously clocked signal can be generated.

SUMMARY OF THE INVENTION

A novel method for generating an asynchronously clocked signal in a synchronously clocked programmable device is described. The novel method can be implemented in any PLD irrespective of whether the PLD supports asynchronous clocking. In accordance with one embodiment of the present invention, an input signal and an event signal are received. The input signal and the event signal can be any externally or internally generated signal. The event signal signifies the occurrence of a particular event by transitioning from one signal state to another. An internally generated event signal could be, for example, a product term signal generated by an AND array and output from an OR array. In accordance with the present invention the input signal is asynchronously clocked through the synchronously clocked PLD in response to an edge transition of the event signal. The edge transition can be a falling edge or a rising edge.

In accordance with another embodiment of the present invention, a novel method for generating an asynchronously clocked signal in a synchronously clocked programmable device is described. An input signal and an event signal are received. A first polarity signal is generated at a first node when the event signal is in a first logic state. The first polarity signal remains unchanged when the event signal is in a second logic state. An asynchronously clocked signal is generated at a second node in response to a first transition edge of the event signal. The asynchronously clocked signal has the same polarity as the first polarity signal. The asynchronously clocked signal remaining unchanged in response to a second transition edge of the event signal.

A novel circuit for generating an asynchronously clocked signal in a synchronously clocked programmable device is also described. The novel circuit can be implemented in any PLD irrespective of whether the PLD supports asynchronous clocking. In one embodiment of the present invention the circuit includes first circuitry for receiving an input signal and an event signal. The first circuitry generating an intermediate signal having a same signal state as the input signal when the event signal is in a first signal state. The intermediate signal remaining in the same signal state when the event signal is in a second signal state. The circuit also includes second circuitry, coupled to the first circuitry and the event signal, for receiving the intermediate signal. The second circuitry providing the asynchronously clocked signal from the intermediate signal in response to a transition edge of the event signal.

In another embodiment of the present invention, a programmable logic device (PLD) is described. The PLD includes at least one input and at least one clock input. The PLD also includes a product term array, coupled to the at least one input, and having a first plurality of combinatorial logic gates. The first plurality of combinatorial logic gates could include, for example, AND gates. The PLD also includes a product term allocator, coupled to the product term array, for receiving at least one AND term from the product term array. The product term allocator having a second plurality of combinatorial logic gates may comprise, for example, OR gates. The PLD also includes at least one macrocell, coupled to the product term allocator and at least one output, having at least one register synchronously clocked by a clock signal received from the at least one clock input. The first plurality of combinatorial logic gates coupled to the second plurality of combinatorial logic gates such that a signal, generated either internally or externally, is asynchronously clocked through the PLD without utilizing the synchronously clocked register.

Other features and advantages of the present invention will be apparent from the accompanying drawings and from the detailed description that follows.

BRIEF DESCRIPTION OF THE DRAWINGS

The features and advantages of the present invention is illustrated by way of example and is by no means intended to limit the scope of the present invention to the particular embodiments shown.

DETAILED DESCRIPTION

A novel method and apparatus for generating an asynchronously clocked signal in a synchronously clocked programmable device is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
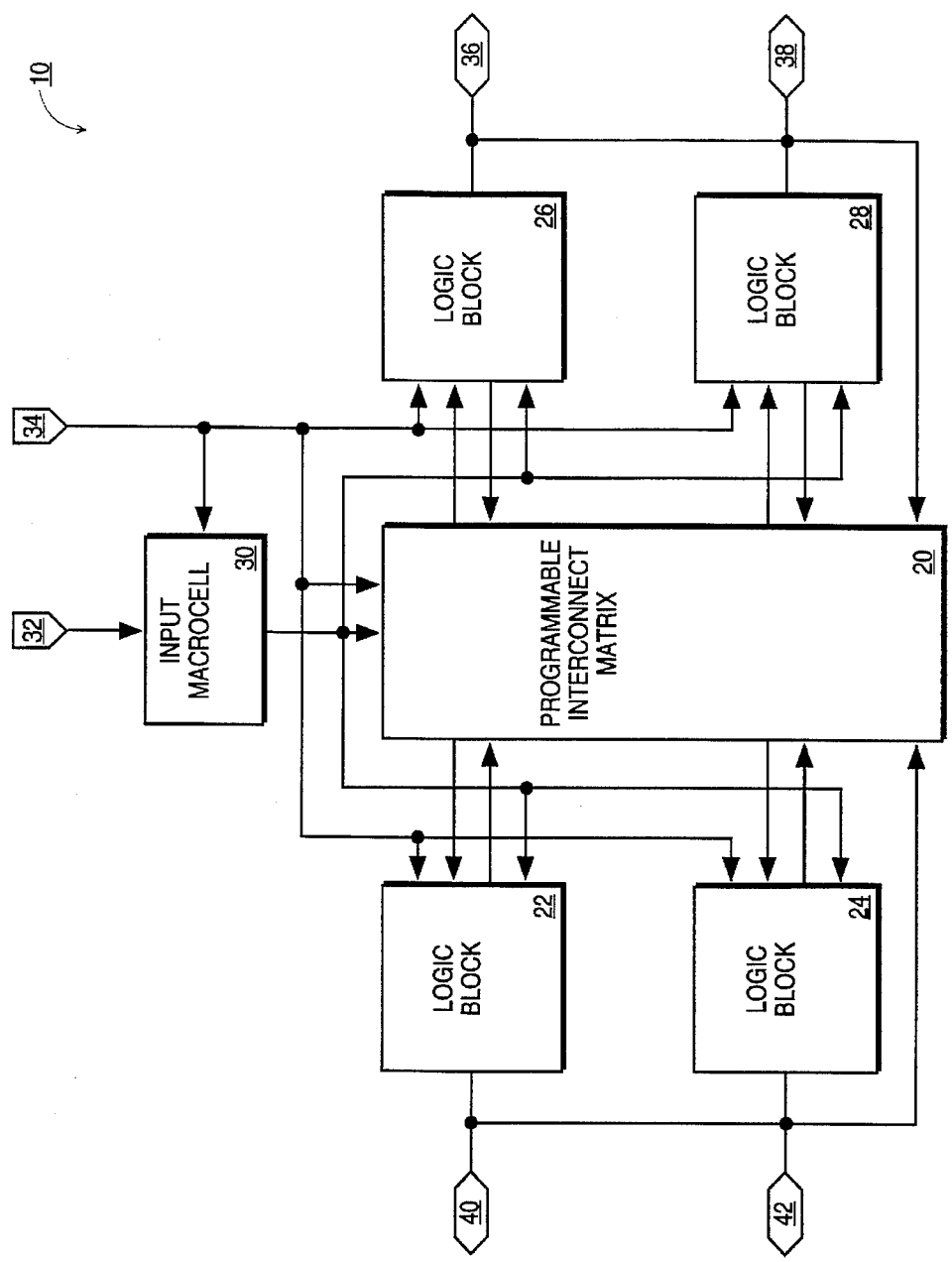
FIG. 1 illustrates in block diagram form a synchronously clocked programmable device in which the present invention may be implemented.

FIG. 1 illustrates in block diagram form a synchronously clocked programmable device 10 in which the present invention may be implemented. The architecture illustrated by synchronously programmable device 10 is similar to the architecture of the FLASH370™ family of PLDs provided by Cypress Semiconductor Corporation. It will be appreciated by one of ordinary skill in the art, that the present invention is not limited, however, to the architecture illustrated in FIG. 1. The present invention may be implemented in any PLD, CPLD, ASIC or FPGA having synchronously clocked or product termed clocked registers in which an asynchronously generated signal is required.

The synchronously clocked programmable device 10 is responsive to dedicated input signal 32, dedicated system clock signal 34, and input/output (I/O) signals 36, 38, 40 and 42. The dedicated input signal 32 can comprise a singular dedicated input signal as shown, or a plurality of dedicated input signals (e.g. two). The dedicated input signal 32 comprises digital data input to be utilized by the PLD. The dedicated input signal 32 is coupled to programmable interconnect matrix (PIM) 20, input macrocells 30 and to logic blocks 22, 24, 26 and 28.

Similarly, the dedicated system clock signal 34 can comprise a singular dedicated system clock signal as shown, or a plurality of dedicated system clock signals (e.g. four). The dedicated system clock signal 34 is coupled to each of the logic blocks 22, 24, 26 and 28, as well as PIM 20. The dedicated system clock is utilized to synchronously clock through logic blocks 22, 24, 26 and 28, dedicated input signal 32 and signals received from PIM 20.

PIM 20 consists of a global routing matrix which automatically routes to logic blocks 22, 24, 26, or 28 signals received from dedicated input signal 32 via input macrocells 30, dedicated system clock 34, I/O signals 36, 38, 40 and 42, or the outputs of logic blocks 22, 24, 26 and 28. The routing of PIM 20 can be accomplished with the aid of various software or hardware techniques known in the art. Further, PIM 20 illustrated in FIG. 1 is not required to practice the invention, rather, what is required is a means for routing to logic blocks 22, 24, 26 and 28 the dedicated input signal 32, the I/O signals 36, 38, 40 and 42, and the outputs of logic blocks 22, 24, 26 and 28.

FIG. 1 further illustrates logic blocks 22, 24, 26 and 28. Although four logic blocks are illustrated, it will be appreciated by one skilled in the art that there may exist only one logic block or a plurality of logic blocks (e.g. eight). Logic blocks 22, 24, 26 and 28 generate the output signals of I/O signals 36, 38, 40 and 42 in response to dedicated input signal 32 via input macrocells 30, dedicated system clock 34, and signals received PIM 20. Furthermore, at least one of the logic blocks includes the present invention such that a signal can be asynchronously clocked through the PLD.

Figure 2:
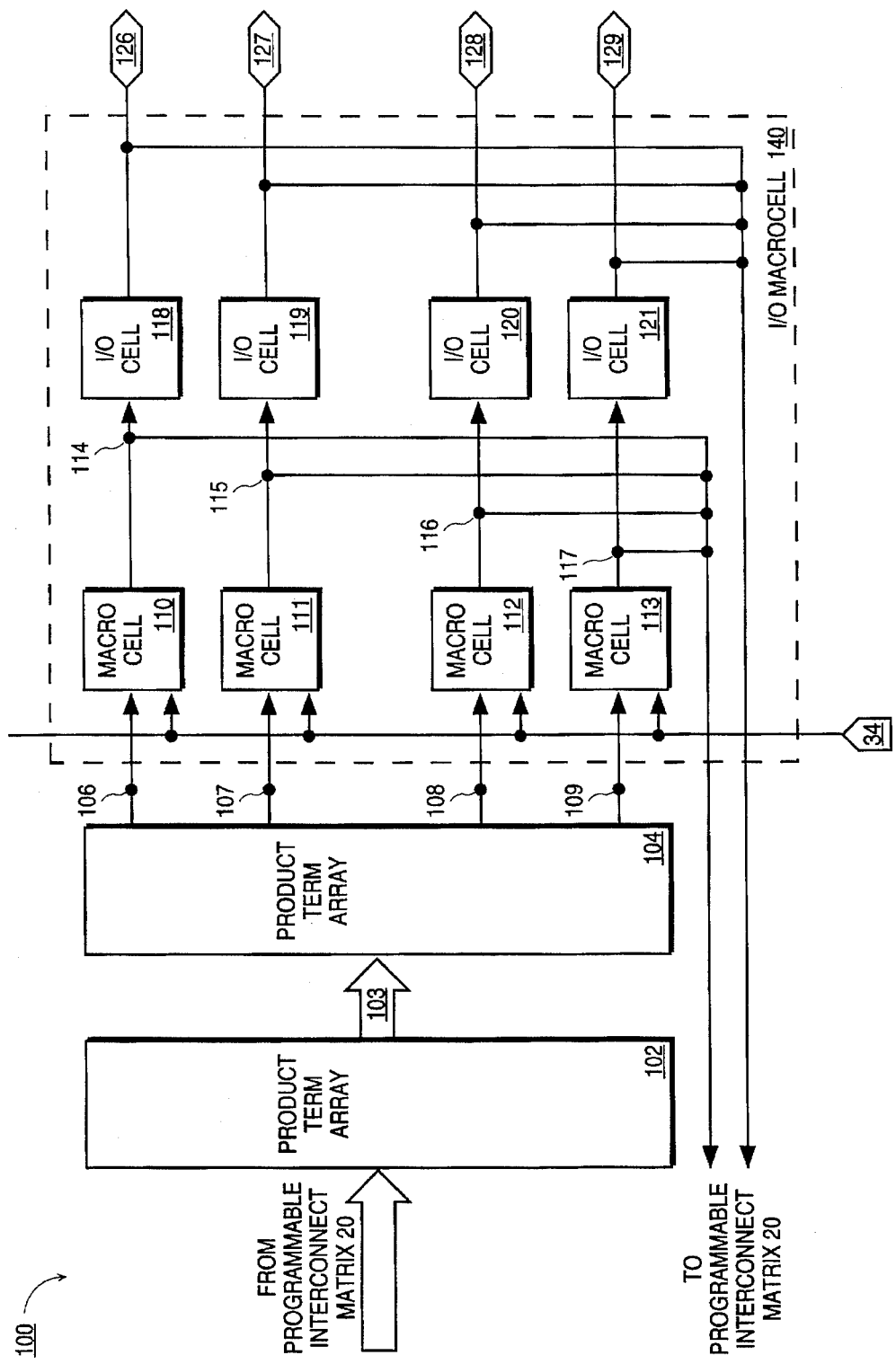
FIG. 2 illustrates a logic block of a synchronously clocked programmable device in which the present invention may be implemented.

By way of example, logic block 22 is illustrated in greater detail in FIG. 2 as logic block 100. Logic block 100 comprises a product term array 102, a product term allocator 104 and an I/O macrocell 140. I/O macrocell 140 comprises macrocells 110, 111, 112 and 113 coupled to I/O cells 118, 119, 120 and 121 respectively. Logic block 100 receives routed signals outputted from PIM 20 and input signals of I/O signals 126, 127, 128 and 129. Further, logic block 100 generates output signals of I/O signals 126, 127, 128 and 129.

Product term array 102 illustrated in FIG. 2 is coupled to PIM 20 of FIG. 1 and receives routed signals outputted from PIM 20. The number of routed signals outputted by PIM 20 and received by logic block 100, could be a singular signal or a plurality of signals (e.g. 36 signals). Product array 102 applies combinatorial logic, such as AND gates, to the routed signals received from PIM 20 to generate AND terms onto bus 103. The number of AND terms generated may be a singular product term or a plurality of AND terms (e.g. 86).

Product term array 102 is coupled to product term allocator 104 via bus 103. Product term allocator 104 receives the AND terms generated by product term array 102 and applies combinatorial logic, such as OR gates, to the AND terms to generate a plurality of product terms at nodes 106, 107, 108 and 109. It will be appreciated by one skilled in the art that product term array 102 and product term allocator 104 may comprise, for example, AND gates and OR gates respectively, or NOR gates and NOR gates respectively.

The plurality of product terms generated by product term allocator 104 are received by macrocells 110, 111, 112 and 113 of I/O macrocell 140. Macrocells 110, 111, 112 and 113 also receive dedicated system clock 34 which enables macrocells 110, 111, 112 and 113 to synchronously clock onto nodes 114, 115, 116 and 117, the plurality of product terms generated by product term allocator 104. The signals at nodes 114, 115, 116 and 117 are coupled to I/O cells 118, 119, 120 and 121 are also fed back into PIM 20 of FIG. 1. FIG. 2 illustrates an I/O macrocell having four macrocells 110, 111, 112 and 113, and four corresponding I/O cells 118, 119, 120 and 121. However, it will be appreciated by one skilled in the art the number of macrocells and I/O cells could be any number. The function and exemplary composition of macrocell 110 and I/O cell 118 of I/O macrocell 140 is further illustrated in FIG. 3.

Figure 3:
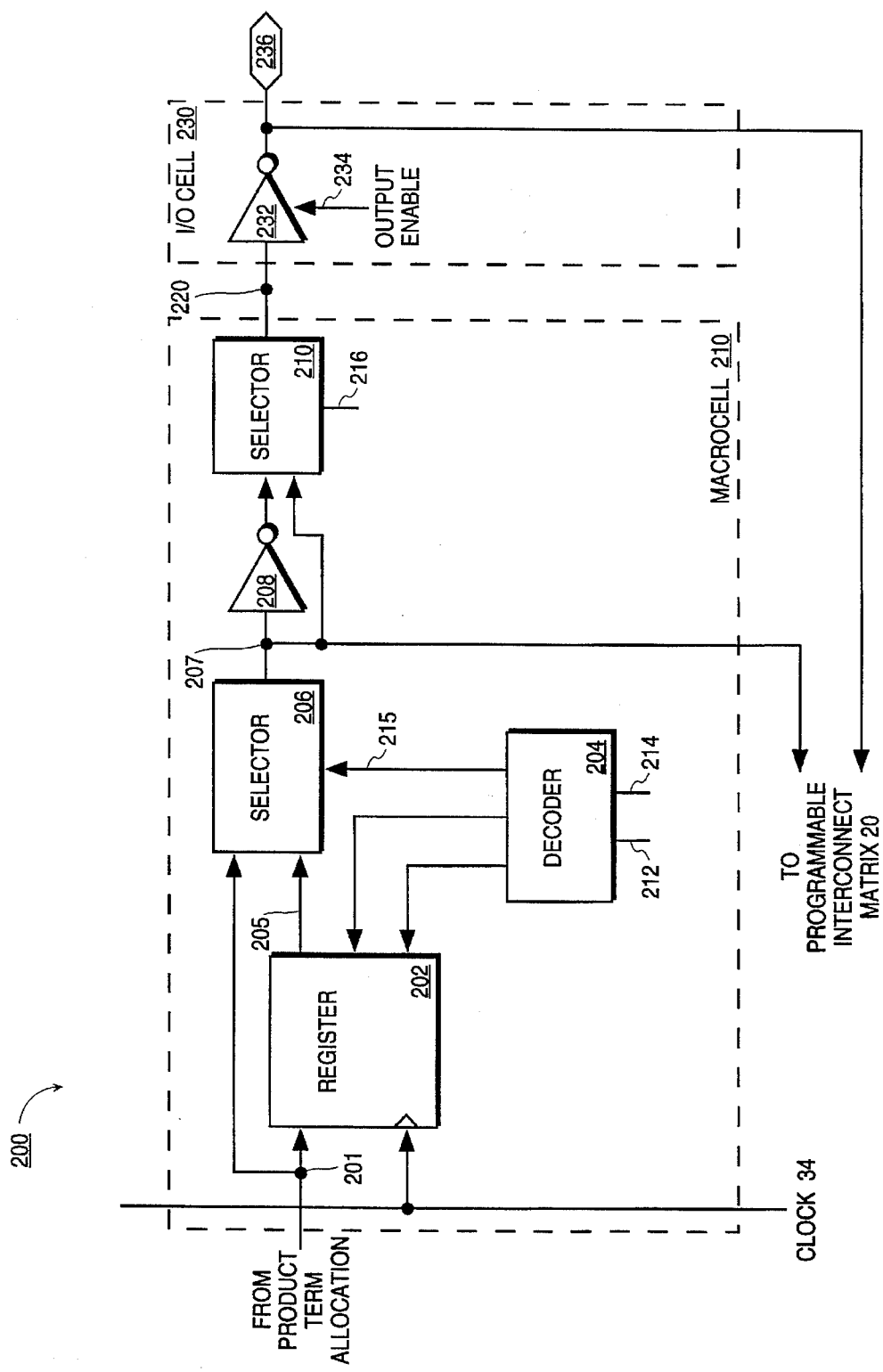
FIG. 3 illustrates an I/O Macrocell having a synchronously clocked register element.

FIG. 3 illustrates an I/O macrocell 200 comprising a macrocell 210 coupled to an I/O cell 230. The macrocell 210 comprises, by way of illustration, a register 202, decoder 204, selector 206, inverter 208, and selector 210. Register 202 receives one of the plurality of product terms generated by product term allocator 104 at node 201. The product term at node 201 is coupled to register 202 and selector 206. The product term at node 201 is synchronously clocked through register 202 onto node 205 in response to dedicated system clock 34. Additionally, register 202 can be programmed to be various types of registers in response to control signals received from decoder 204 which is controlled by control signals 212 and 214. For example, register 202 could be programmed to be a D flip-flop or a T flip-flop. It will be appreciated by those skilled in the art, however, that register 202 need not be a programmed register to practice the present invention. Based on the output of decoder 204 at node 215, selector 206 determines whether the product term at node 201 or the signal at node 205 is provided to node 207 and is fed back to PIM 20. Inverter 208, selector 210 and control signal 216 then couple either the signal at node 207 or its logical inverse to node 220.

Node 220 is coupled to the input of I/O cell 230. I/O cell 230 comprises a buffer 232 which is controlled by output enable 234. When I/O cell 230 functions as an output cell, output enable 234 enables buffer 232 to provide I/O signal 236 which is output from the PLD and also fed back to PIM 20. Output enable 234 disables buffer 232 when I/O cell 230 functions as an input cell.

As illustrated in FIGS. 1, 2 and 3, a dedicated input signal 32 or any signal routed through PIM 20 can be received by logic block 22 (or any of the other logic blocks 24, 26, or 28). These input signals to logic block 22 can then be received by product term array 102 which generates AND terms onto bus 103. The AND terms are received by product term allocator 104 which generates a plurality of product terms. One of the plurality of product terms is received by macrocell 210 and can by synchronously clocked by dedicated system clock 34 through register 202 and outputted as I/O signal 236, as well as, fed back into PIM 20. It will be appreciated that the synchronously clocked PLD 10 illustrated in FIGS. 1, 2, and 3, provides only synchronously clocked registers, such as register 202, and does not provide a method or apparatus for asynchronously clocking a signal through a logic block without using a synchronously or product term clocked register element in an I/O macrocell. It is within this environment that the present invention is implemented.

Figure 4:
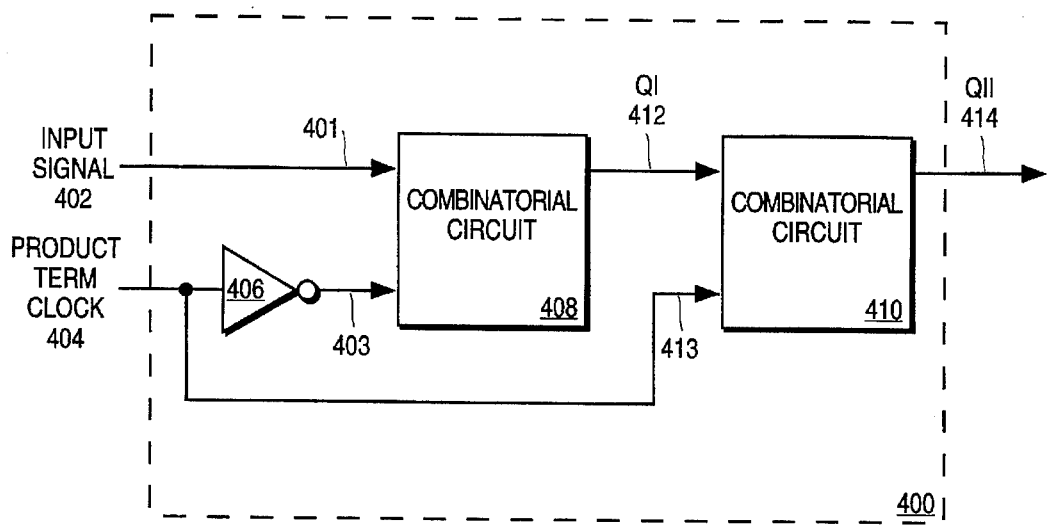
FIG. 4 illustrates a first embodiment of the present invention.

A first embodiment of the present invention is illustrated in FIG. 4. FIG. 4 illustrates a rising edge-triggered flip-flop 400 comprising combinatorial circuits 408 and 410, and inverter 406. Combinatorial circuits 408 and 410 may comprise a latch or other logic elements comprised of combinatorial logic such as AND gates, OR gates, or NOR gates. Rising edge-triggered flip-flop 400 receives input signal 402 and product term clock 404, and generates an asynchronous output signal QII at node 414. Combinatorial circuit 408 has two input terminals 401 and 403. The first input terminal 401 receives input signal 402, and the second input terminal 403 receives the logical inverse of the product term clock 404 as provided by inverter 406. Combinatorial circuit 410 also has two input terminals 412 and 413. Input terminal 412 is coupled to receive a signal generated by combinatorial circuit 408. Input terminal 413 is coupled to product term clock 404. Combinatorial circuit 410 provides an asynchronous output signal QII at node 414.

Input signal 402 can be any signal which is generated internal or external to a PLD. In addition, product term clock 404 can be any internally or externally generated signal. For example, product term clock 404 can be a signal that was generated by a logic block, such as logic blocks 22, 24, 26, or 28 of FIG. 1, which was routed back through PIM 20. Alternatively, product term clock 404 can be any dedicated input signal or I/O signal. It will also be appreciated by one skilled in the art, that the product term clock need not be a conventional or synchronous clock signal, that is, the product term clock 404 may simply be a one-time transition edge which signals an event to take place such as moving from one state to another in a state machine (i.e., an event signal).

In operation, when rising edge-triggered flip-flop 400 receives a transition edge on product term clock 404 the input signal 402 can be asynchronously clocked as asynchronous output signal QII at node 414. More particularly, when product term clock 404 is in a first logic state, such as a low voltage level, input signal 402 is received by combinatorial circuit 408 at input terminal 401 and is provided as intermediate signal QI at node 412. QI having the same logic level as input signal 402. When product term signal 404 transitions from the first logic state to a second logic state, for example, from a low voltage level to a high voltage level, combinatorial circuit 410 produces asynchronous output signal QII at node 414 which has the same logical state as QI at node 412.

When product term clock 404 is in the second logic state, the intermediate signal QI at node 412 retains its logical state regardless of the logical state of input signal 402. When the product term clock 404 transitions back from the second logic state to the first logic state, the asynchronous output signal at node 414 retains its logical state, while the intermediate signal QI at node 412 once again has the same logical state as that of input signal 404.

Figure 5:
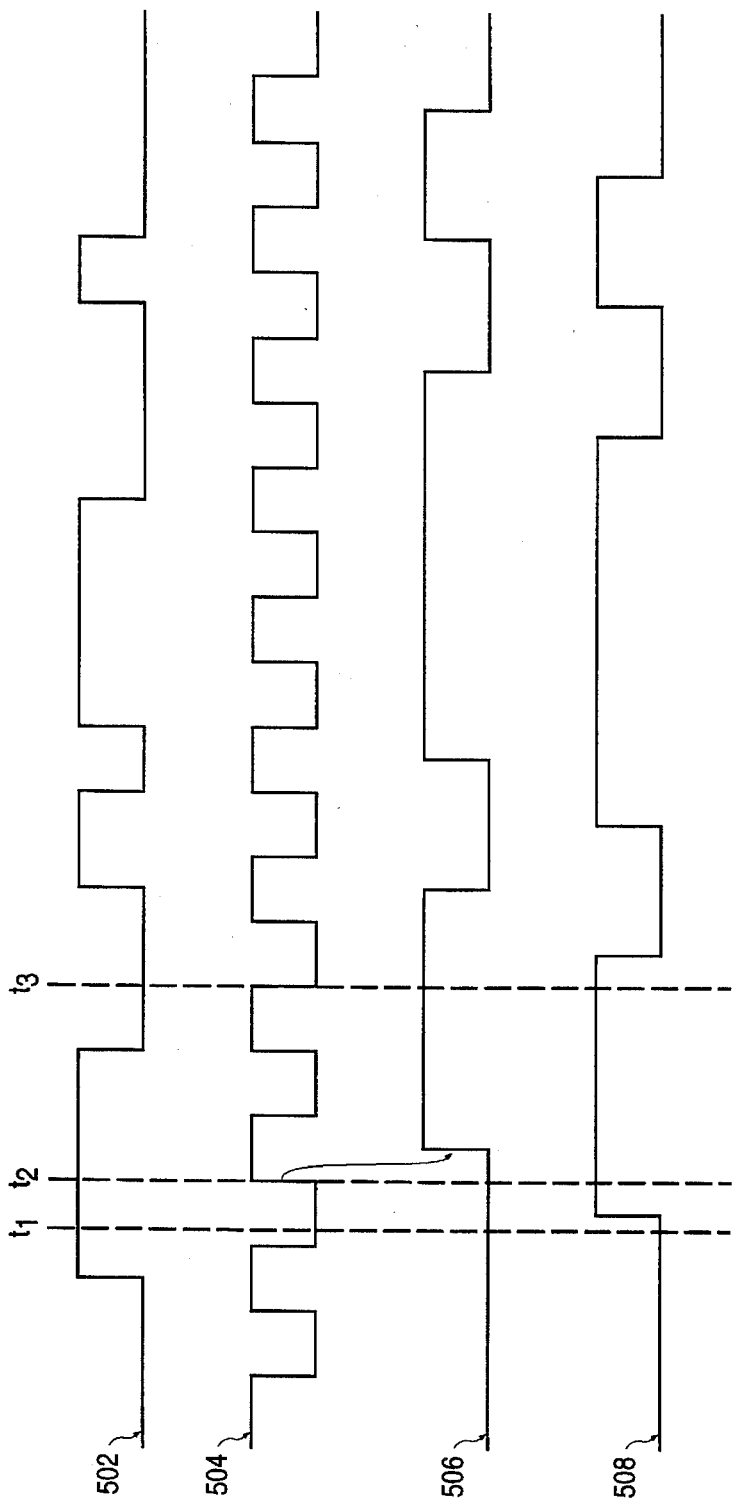
FIG. 5 illustrates in timing diagram form the operation of the present invention of FIG. 4.

FIG. 5 illustrates in timing diagram form the operation of rising edge-triggered flip-flop 400 of the present invention illustrated in FIG. 4. As illustrated at time t1, when product term clock 404 (waveform 504) is in a first logic state, e.g. a low voltage level, input signal (waveform 502) is provided as intermediate signal QI at node 412 (waveform 508) and has the same logic state as input signal 402, e.g. a high voltage level. The intermediate signal at node 412 appears later in time than input signal 402 to account for the delay through combinatorial circuit 408 in order to generate the intermediate signal QI at node 412. When a transition edge on product term clock 404 (waveform 504) occurs at time t2, combinatorial circuit 410 provides asynchronous output signal QII at node 414 (waveform 506) having the same signal state as the intermediate signal QI at node 412 and input signal 402, e.g. a high voltage level as shown in FIG. 5.

As further illustrated in FIG. 5 at time t3, when product term clock 404 (waveform 504) transitions from a second logic state to a first logic state, e.g. from a high voltage state to a low voltage state, the asynchronous output signal at node 414 (waveform 506) retains its logic state regardless of the logic state of input signal 402 (waveform 502).

Therefore, the present invention as disclosed in the embodiment of FIG. 4, illustrates a rising edge-triggered flip-flop 400 which asynchronously clocks an input signal 402 through a PLD in response to a rising edge transition on a product term clock 404 which is not a dedicated system clock. Furthermore, the asynchronously generated signal is not generated utilizing a register element such as register 202 in macrocell 210 of FIG. 3.

Figure 6:
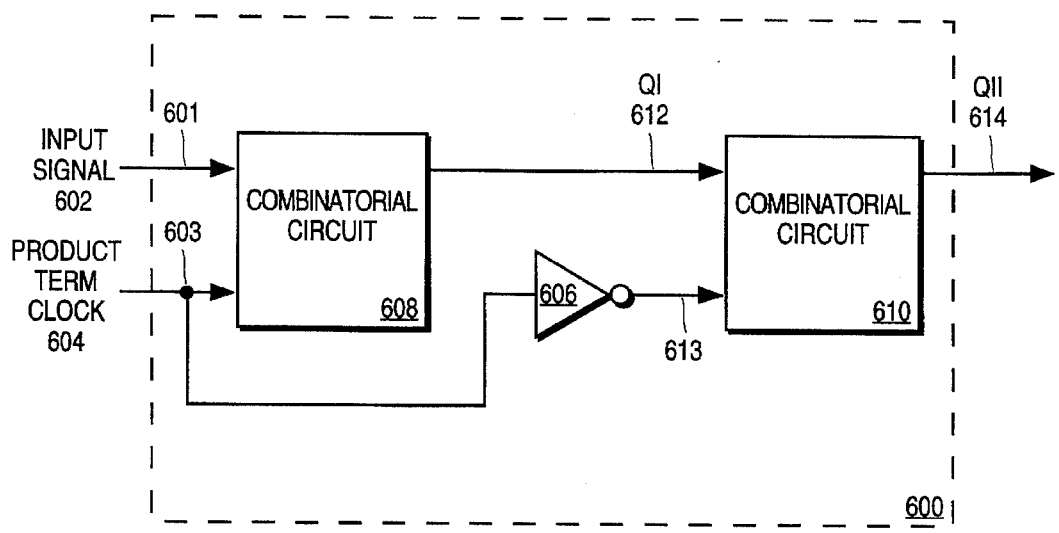
FIG. 6 illustrates a second embodiment of the present invention.

A second embodiment of the present invention is illustrated in FIG. 6. FIG. 6 illustrates a falling edge-triggered flip-flop 600 comprising combinatorial circuits 608 and 610, and inverter 606. Combinatorial circuits 608 and 610 may comprise a latch or other logic elements comprised of combinatorial logic such as AND gates, OR gates, or NOR gates. Falling edge-triggered flip-flop 600 receives input signal 602 and product term clock 604, and generates an asynchronous output signal QII at node 614. Combinatorial circuit 608 has two input terminals 601 and 603. The first input terminal 601 receives input signal 602, and the second input terminal 603 receives product term clock 604. Combinatorial circuit 610 also has two input terminals 612 and 613. Input terminal 612 is coupled to receive a signal generated by combinatorial circuit 608. Input terminal 613 receives the inverse of product term clock 604 via inverter 606. Combinatorial circuit 610 provides an asynchronous output signal QII at node 614.

Input signal 602 can be any signal which is generated internal or external to a PLD. In addition, the product term clock 604 can be any internally or externally generated signal. For example, product term clock 604 can be a signal that was generated by a logic block, such as logic blocks 22, 24, 26, 28 of FIG. 1, which was routed back through PIM 20. Alternatively, product term clock 604 can be any dedicated input signal or I/O signal. It will also be appreciated by one skilled in the art, that the product term clock need not be a conventional or synchronous clock signal, that is, the product term clock 604 may also simply be a one-time transition edge which signals an event to take place such as moving from one state to another in a state machine (i.e., an event signal).

In operation, when falling edge-triggered flip-flop 600 receives a transition edge on product term clock 604 the input signal 602 can be asynchronously clocked as asynchronous output signal QII at node 614. More particularly, when the product term clock 604 is in a first logic state, such as a high voltage level, the input signal 602 is received by combinatorial circuit 608 at input terminal 601 and is provided as intermediate signal QI at node 612. QI having the same logic level as input signal 602. When product term signal 604 transitions from the first logic state to a second logic state, for example, from a high voltage level to a low voltage level, combinatorial circuit 610 produces the asynchronous output signal QII at node 614 which has the same logical state as QI at node 612.

When product term clock 604 is in the second logic state, intermediate signal QI at node 612 retains its logical state regardless of the logical state of input signal 602. When product term clock 604 transitions back from the second logic state to the first logic state, asynchronous output signal at node 614 retains its logical state, while intermediate signal QI at node 612 once again has the same logical state as that of input signal 604.

Figure 7:
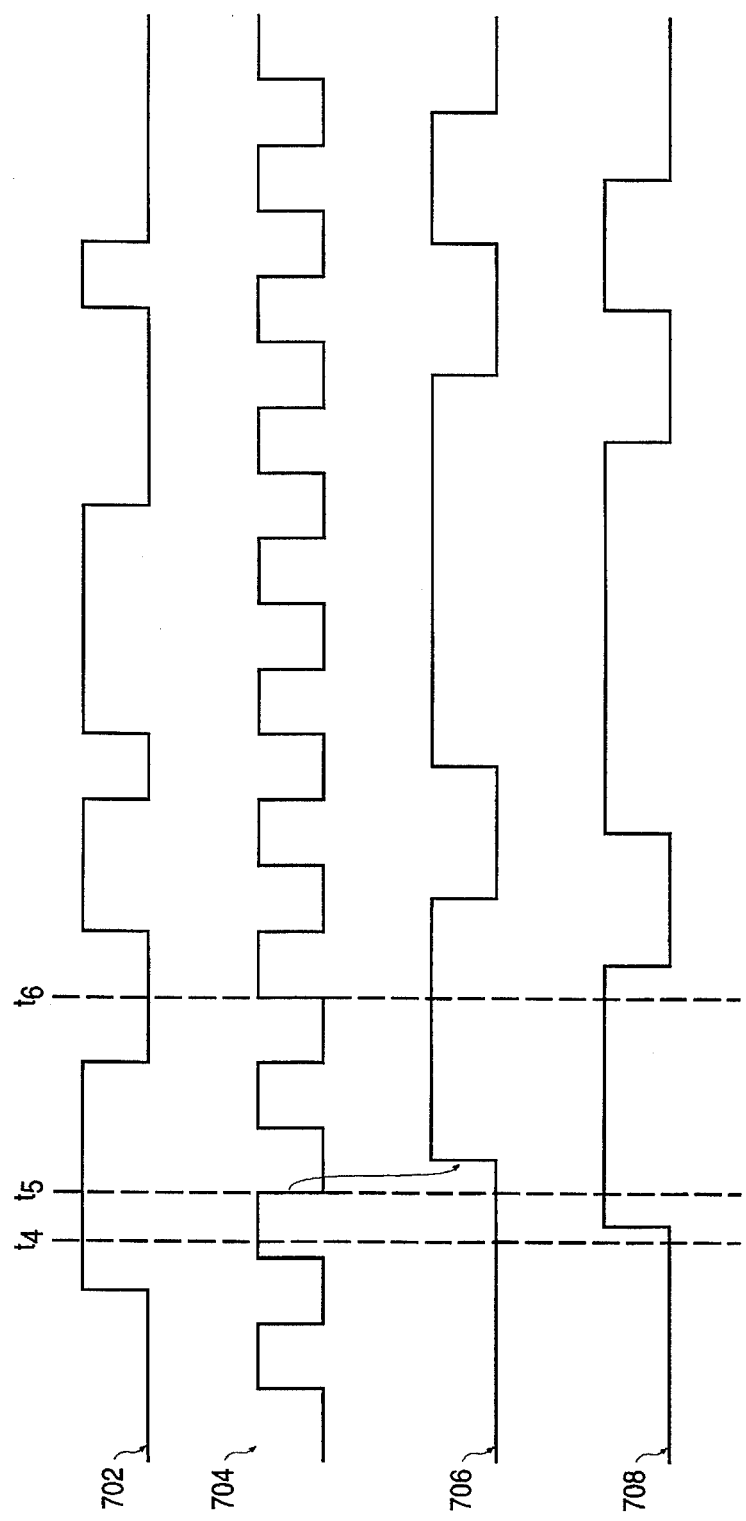
FIG. 7 illustrates in timing diagram form the operation of the present invention of FIG. 6.

FIG. 7 illustrates in timing diagram form the operation of falling edge-triggered flip-flop 600 of the present invention illustrated in FIG. 6. As illustrated at time t4, when product term clock 604 (waveform 704) is in a first logic state, e.g. a high voltage level, input signal 602 (waveform 702) is provided as intermediate signal QI at node 612 (waveform 708) and has the same logic state as input signal 602, e.g. a high voltage level. The intermediate signal at node 612 appears later in time than input signal 602 to account for the delay through combinatorial circuit 608 in order to generate the intermediate signal QI at node 612. When a transition edge on product term clock 604 (waveform 704) occurs at time t5, combinatorial circuit 610 provides asynchronous output signal QII at node 614 (waveform 706) having the same signal state as intermediate signal QI at node 612 and input signal 602, e.g. a high voltage level as shown in FIG. 7.

As further illustrated in FIG. 7 at time t6, when product term clock 604 (waveform 704) transitions from a second logic state to a first logic state, e.g. from a low voltage state to a high voltage state, the asynchronous output signal at node 614 (waveform 706) retains its logic state regardless of the logic state of input signal 602 (waveform 702).

Therefore, the present invention as disclosed in the embodiment of FIG. 6, illustrates a falling edge-triggered flip-flop 600 which asynchronously clocks an input signal 602 through a PLD in response to a falling edge transition on a product term clock 604 which is not a dedicated system clock. Furthermore, the asynchronously generated signal is not generated utilizing a register element such as register 202 in macrocell 27 of FIG. 3.

Figure 8:
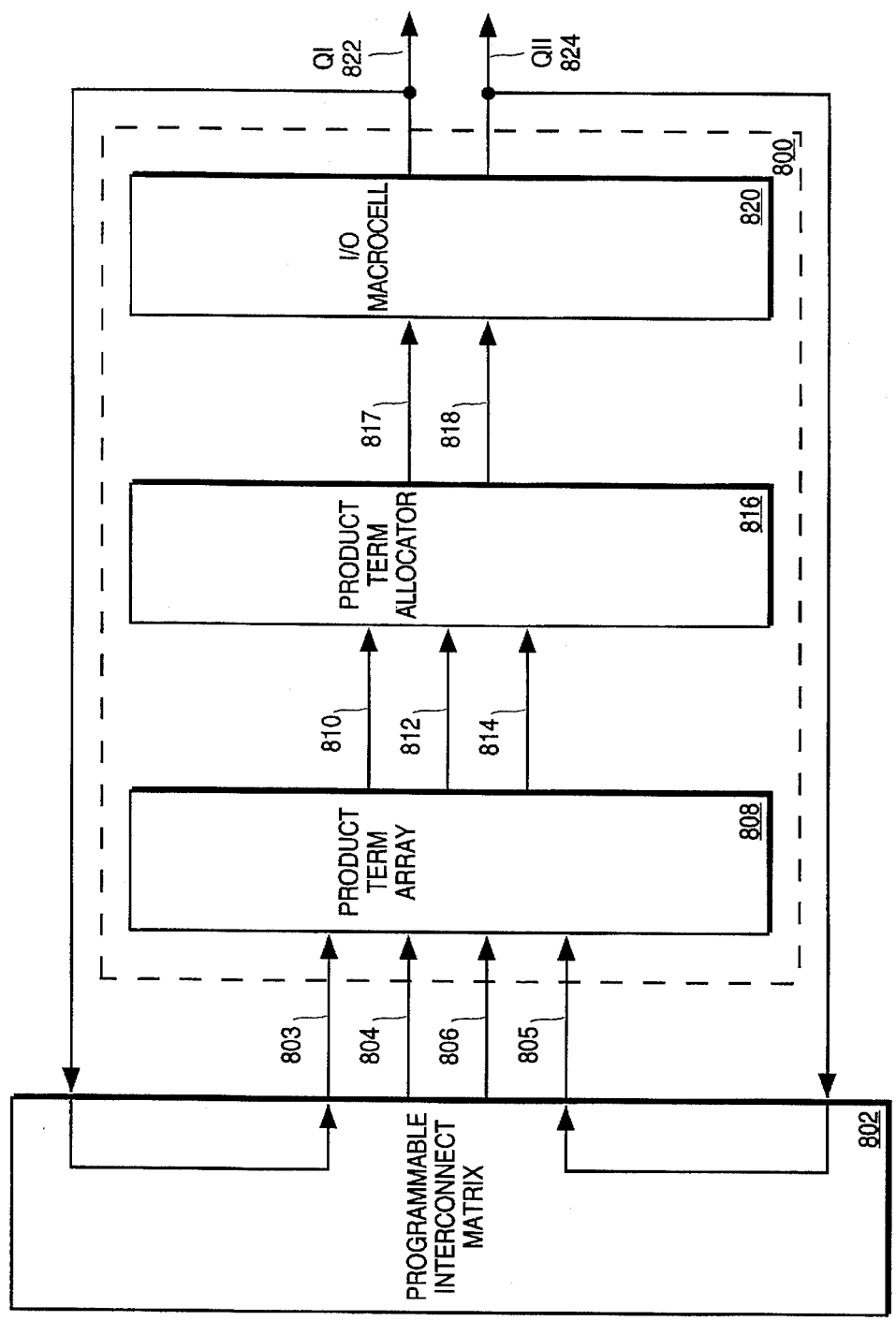
FIG. 8 illustrates a third embodiment of the present invention.

FIG. 8 illustrates a third embodiment of the present invention. The third embodiment illustrated in FIG. 8 is one example of how the present invention illustrated in FIG. 4 or FIG. 5 can be implemented within the architecture of the synchronously programmable logic device illustrated in FIGS. 1, 2 and 3.

FIG. 8 illustrates a programmable interconnect matrix 802 (PIM) which functions in the same manner as PIM 20 coupled to logic block 800 which functions in the same manner as logic blocks 22, 24, 26 or 28. Logic block 800 comprises product term array 808, product term allocator 816 and I/O macrocell 820. Product term array 808 is coupled to PIM 802 and receives from PIM 802 input signal (I) at node 804, product term clock (L) at node 806, intermediate signal QI at node 822 which is routed from the output of I/O macrocell 820 through PIM 802 to node 803, and asynchronous output signal QII at node 824 which is routed through PIM 802 to node 805. Product term array 808 applies combinatorial logic, such as AND gates, to the signals received at nodes 803, 804, 805 and 806 and generates three AND terms at nodes 810, 812 and 814. Product term allocator 816 receives the AND terms at nodes 810, 812 and 814, applies combinatorial logic, such as OR gates, to generate product terms at nodes 817 and 818. It will be appreciated by one skilled in the art that I at node 804 and L at node 806 can be any internally or externally generated signal of a PLD. It will also be appreciated by one skilled in the art that product term array 808 and product term allocator 816 may comprise, for example, AND gates and OR gates respectively, or NOR gates and NOR gates respectively.

When L at node 804 is in a first logic state, product term array 808, product term allocator 816 and I/O macrocell 820 produce intermediate signal QI at node 822 having a same logic state as that of I at node 804. When L makes an edge transition from the first logic state to a second logic state, product term array 808, product term allocator 816 and I/O macrocell 820 produce asynchronous output signal QII at node 824 having the same logic state as intermediate signal QI at node 822. When L at node 804 makes an edge transition back from the second logic state to the first logic state, product term array 808, product term allocator 816 and I/O macrocell 820 produce asynchronous output signal QII at node 824 retaining the same logic state regardless of the logic state of I at node 804 or of intermediate signal QI at node 822. Intermediate signal QI at node 822 and asynchronous output signal at node 824 are provided by I/O macrocell 820 without utilizing a dedicated system clock such as dedicated system clock 34, and without using a register element such as register 202 illustrated in FIG. 3.

Figure 9:
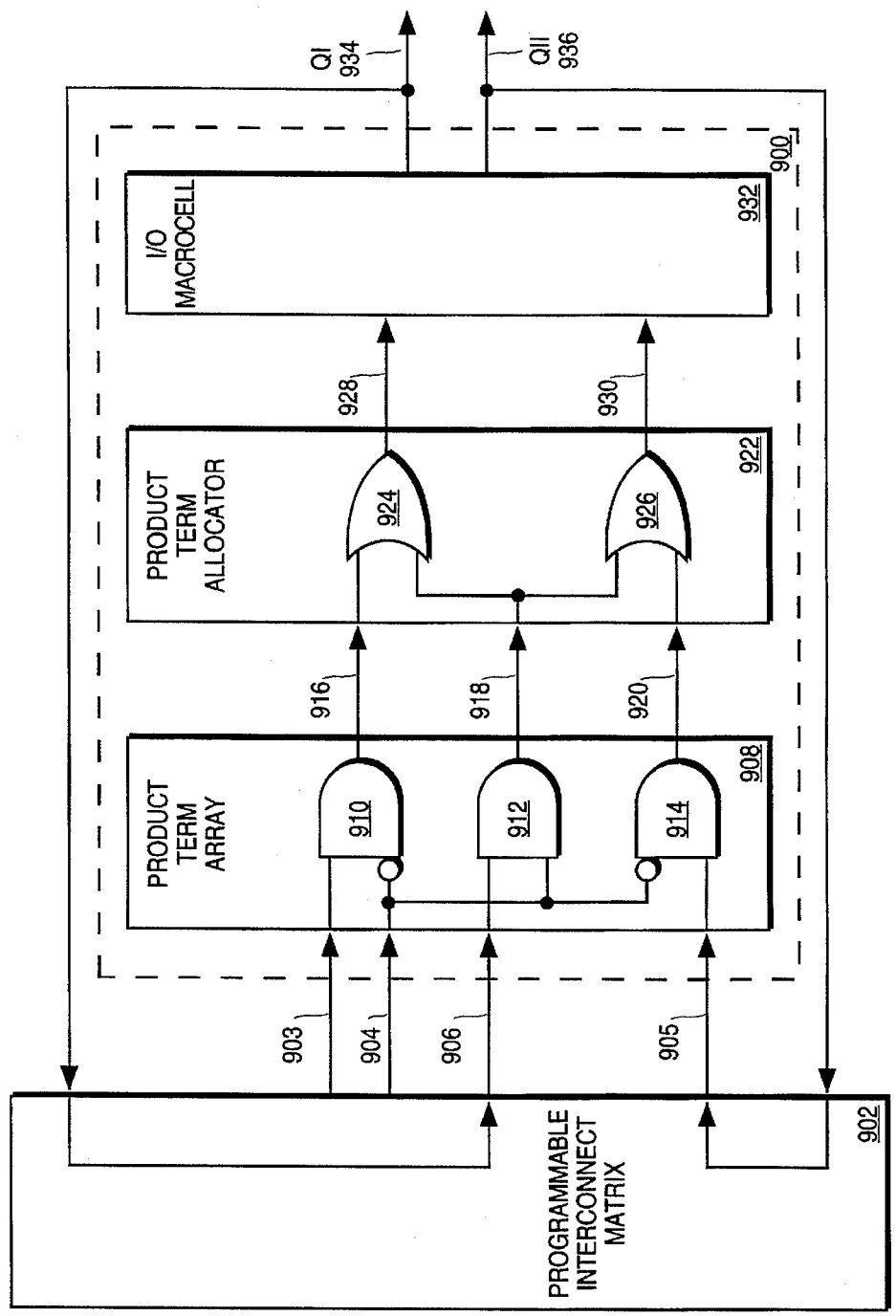
FIG. 9 illustrates a fourth embodiment of the present invention.

FIG. 9 illustrates a fourth embodiment of the present invention. The fourth embodiment illustrated in FIG. 9 is one example of how the present invention illustrated in FIG. 7 and FIG. 4, that is, a rising edge-triggered flip-flop, can be implemented using AND gates in a product term array and OR gates in a product term allocator.

FIG. 9 illustrates a programmable interconnect matrix 902 (PIM) which functions in the same manner as PIM 20 coupled to logic block 900 which functions in the same manner as logic blocks 22, 24, 26 or 28. Logic block 900 comprises product term array 908, product term allocator 922 and I/O macrocell 932. Product term array 908 is coupled to PIM 902 and receives from PIM 902 input signal (I) at node 903, product term clock (L) at node 904, intermediate signal QI which is routed from I/O macrocell 932 through PIM 902 to node 906, and asynchronous output signal QII at node 936 which is routed through PIM 902 to node 905. Product term array 908 applies combinatorial logic to the signals received at nodes 903, 904, 905 and 906 and generates three AND terms at nodes 916, 918 and 920. The combinatorial logic applied by product term array 908 comprises three AND gates 910, 912 and 914. AND gate 903 receives the signal at node 903, and the inverse of the signal at node 904, and outputs the logical AND of these signals at node 916. AND gate 912 receives the signals at nodes 906 and 904, and outputs the logical AND of these signals at node 918. AND gate 914 receives the signal at node 905 and the inverse of the signal at node 904, and outputs the logical AND of these signals at node 920.

When L at node 904 is in a low logic state the AND term at node 916 will be the same logic state as that of I at node 903, the AND term at node 920 will be the same logic state as that of QII provided to node 905, and the AND term at node 918 will be in a low logic state. When L at node 904 is in a high logic state the AND terms at nodes 916 and 920 will be in the low logic state and the AND term at node 918 will be the same logic state as that of QI provided to node 906.

Product term allocator 922 receives the AND terms at nodes 916, 918 and 920, and applies combinatorial OR logic using OR gates 924 and 926 to generate product terms at nodes 928 and 930. OR gate 924 receives the AND terms at nodes 916 and 918 and outputs the logical OR of these signals at node 928. OR gate 926 receives the AND terms at node 918 and 920 and outputs the logical OR of these signals at node 930. The product term at node 928 is in a low logic state if neither of the AND terms at nodes 916 or 918 is in a high logic state. The product term at node 928 is in a high logic state if either of the AND terms at nodes 916 or 918 is in a high logic state. Similarly, the product term at node 930 is in a low logic state if neither of the AND terms at nodes 920 or 918 is in a high logic state. The product term at node 930 is in a high logic state if either of the AND terms at nodes 920 or 918 is in a high logic state.

The product terms at nodes 928 and 930 are then routed through I/O macrocell 932 to nodes 934 and 936 respectively. The product terms at nodes 928 and 930 are routed through I/O macrocell 932 without utilizing clocked register elements contained within I/O macrocell 932.

Therefore, when L at node 904 is in a low logic state, product term array 908, product term allocator 922 and I/O macrocell 932 produce intermediate signal QI at node 934 having a same logic state as that of I at node 903. When L makes a an edge transition from the low logic state to a high logic state, product term array 908, product term allocator 922 and I/O macrocell 932 produce asynchronous output signal QII at node 936 having the same logic state as intermediate signal QI at node 934. When L at node 904 makes an edge transition back from the high logic state to the low logic state, product term array 908, product term allocator 922 and I/O macrocell 932 produce asynchronous output signal QII at node 936 retaining the same logic state regardless of I at node 903 or intermediate signal QI at node 934. Intermediate signal QI at node 934 and asynchronous output signal at node 936 are provided by I/O macrocell 932 without utilizing a dedicated system clock such as dedicated system clock 34 or a register element such as register 202 illustrated in FIG. 3.

Figure 10:
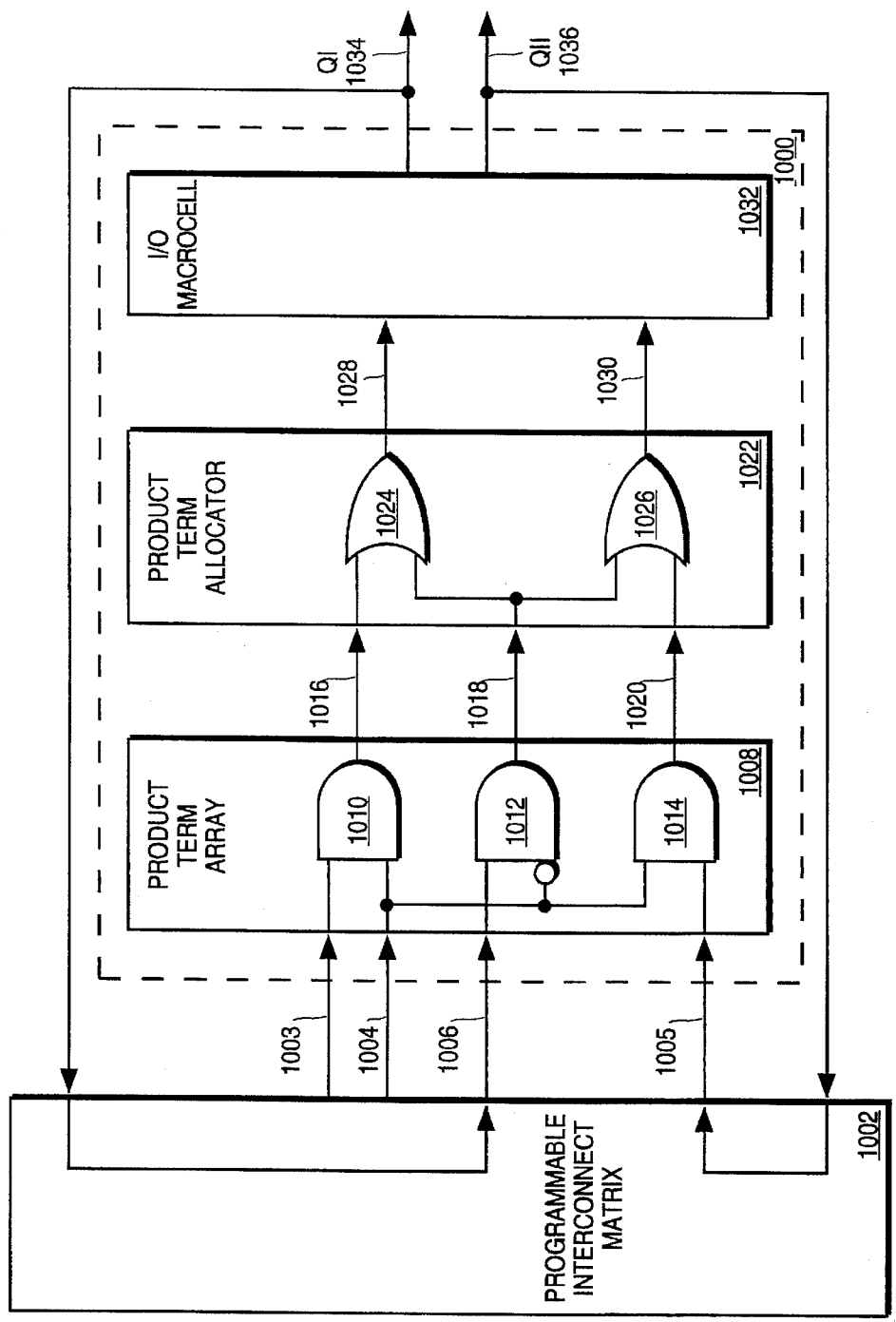
FIG. 10 illustrates a fifth embodiment of the present invention.

FIG. 10 illustrates a fifth embodiment of the present invention. The fifth embodiment illustrated in FIG. 10 is one example of how the present invention illustrated in FIG. 7 and FIG. 6, that is, a falling edge-triggered flip-flop, can be implemented using AND gates in a product term array and OR gates in a product term allocator.

FIG. 10 illustrates a programmable interconnect matrix 1002 (PIM) which functions in a similar manner to PIM 20 coupled to logic block 1000 which functions in a similar manner to logic blocks 22, 24, 26 or 28. Logic block 1000 comprises product term array 1008, product term allocator 1022 and I/O macrocell 1032. Product term array 1008 is coupled to PIM 1002 and receives from PIM 1002 input signal (I) at node 1003, product term clock (L) at node 1004, intermediate signal QI which is routed from I/O macrocell 1032 through PIM 1002 to node 1006, and asynchronous output signal QII at node 1036 which is routed through PIM 1002 to node 1005. Product term array 1008 applies combinatorial logic to the signals received at nodes 1003, 1004, 1005 and 1006 and generates three AND terms at nodes 1016, 1018 and 1020. The combinatorial logic applied by product term array 1008 comprises three AND gates 1010, 1012 and 1014. AND gate 1010 receives the signals at nodes 1003 and 1004, and outputs the logical AND of these signals at node 1016. AND gate 1012 receives the signal at nodes 1006 and the inverse of the signal at node 1004, and outputs the logical AND of these signals at node 1018. AND gate 1014 receives the signals at nodes 1005 and 1004, and outputs the logical AND of these signals at node 1020.

When L at node 1004 is in a high logic state the AND term at node 1016 will be the same logic state as that of I at node 1003, the AND term at node 1020 will be the same logic state as that of QII provided to node 1005, and the AND term at node 1018 will be in a low logic state. When L at node 1004 is in a low logic state the AND terms at nodes 1016 and 1020 will be in a low logic state and the AND term at node 1018 will be the same logic state as that of QI provided to node 1006.

Product term allocator 1022 receives the AND terms at nodes 1016, 1018 and 1020, applies combinatorial OR logic using OR gates 1024 and 1026 to generate product terms at nodes 1028 and 1030. OR gate 1024 receives the AND terms at nodes 1016 and 1018 and outputs the logical OR of these signals at node 1028. OR gate 1026 receives the AND terms at node 1018 and 1020 and outputs the logical OR of these signals at node 1030. The product term at node 1028 is in a low logic state if neither of the AND terms at nodes 1016 or 1018 is in a high logic state. The product term at node 1028 is in a high logic state if either of the AND terms at nodes 1016 or 1018 is in a high logic state. Similarly, the product term at node 1030 is in a low logic state if neither of the AND terms at nodes 1020 or 1018 are in a high logic state. The product term at node 1030 is in a high logic state if either of the AND terms at nodes 1020 or 1018 is in a high logic state.

The product terms at nodes 1028 and 1030 are then routed through I/O macrocell 1032 to nodes 1034 and 1036 respectively. The product terms at nodes 1028 and 1030 are routed through I/O macrocell 1032 without utilizing clocked register elements contained within I/O macrocell 1032.

Therefore, when L at node 1004 is in a high logic state, product term array 1008, product term allocator 1022 and I/O macrocell 1032 produce intermediate signal QI at node 1034 having a same logic state as that of I at node 1003. When L makes a an edge transition from the high logic state to a low logic state, product term array 1008, product term allocator 1022 and I/O macrocell 1032 produce asynchronous output signal QII at node 1036 having the same logic state as intermediate signal QI at node 1034. When L at node 1004 makes an edge transition back from the low logic state to the high logic state, product term array 1008, product term allocator 1022 and I/O macrocell 1032 produce asynchronous output signal QII at node 1036 retaining the same logic state regardless I at node 1004 or intermediate signal QI at node 1034. Intermediate signal QI at node 1034 and asynchronous output signal at node 1036 are provided by I/O macrocell 1032 without utilizing a dedicated system clock such as dedicated system clock 34 or a register element such as register 202 illustrated in FIG. 3.

Figure 11:
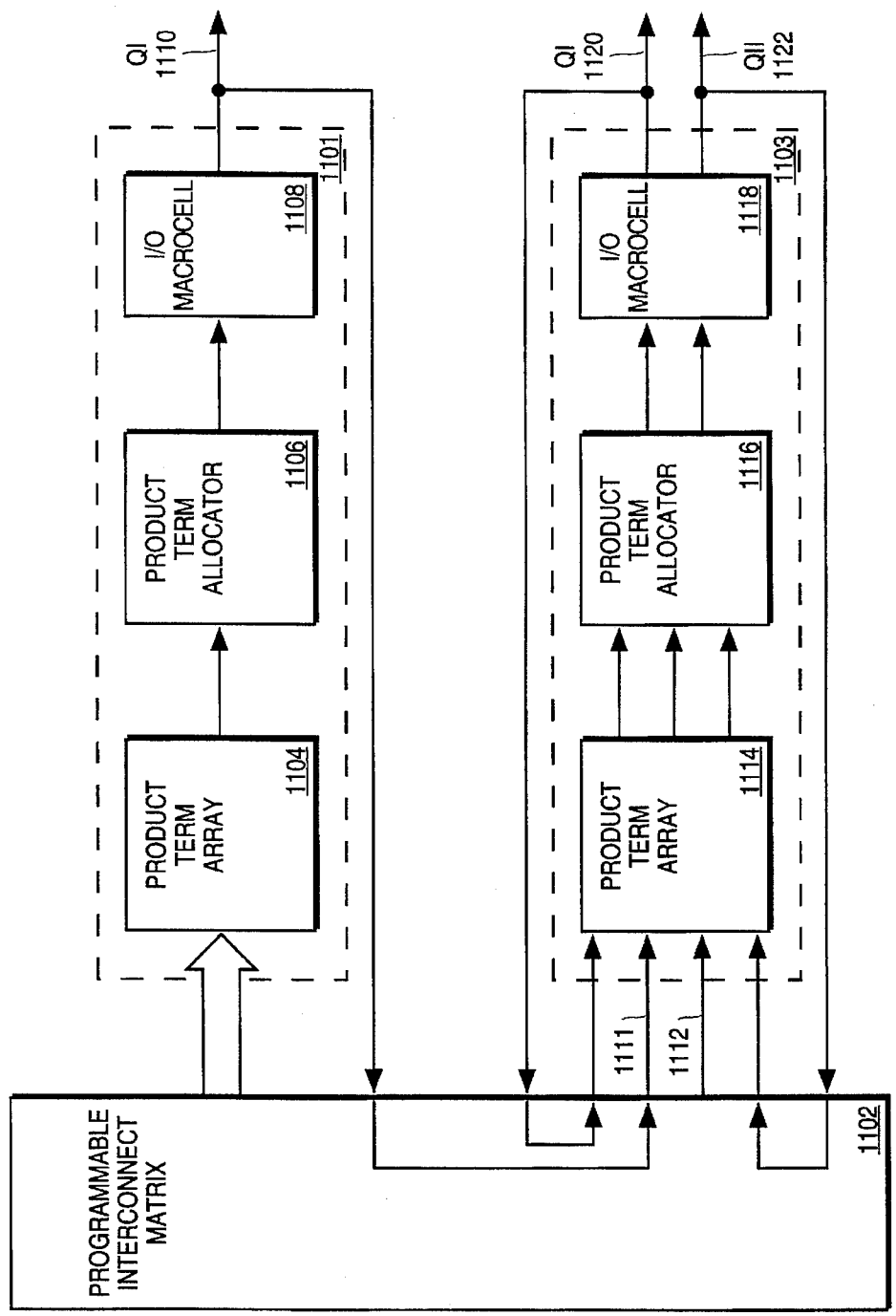
FIG. 11 illustrates a sixth embodiment of the present invention.

In general, architectures accommodating product term clocks are more prone to clock skew and metastability issues in comparison with PLDs having dedicated system clocks. The seventh embodiment of the present invention illustrated in FIG. 11 is one example of how the present invention which solves these problems. In FIG. 11, a product term clock (L) is generated by logic block 1101 and output at node 1110. Logic block 1101 is coupled to receive routed signals from programmable interconnect matrix 1102 (PIM). Logic block 1101 comprises a product term array 1104, a product term allocator 1106, and an I/O macrocell 1108. The product term clock generated at node 1110 is routed through PIM 1102 to logic block 1103. Logic block 1103 comprises product term array 1114, product term allocator 1116 and I/O macrocell 1118. Logic block 1103 receives the product term clock at node 1111 from PIM 1102 and an input signal at node 1112 and can be configured either as a rising edge-triggered flip-flop as illustrated in FIG. 4, or as a falling edge-triggered flip-flop as illustrated in FIG. 5 in order to output an asynchronous signal QII at node 1122.

The present invention illustrated in FIG. 11 forces the product term clock generated at node 1110 to have only one product term in its functional path and to be generated after a known delay time (through logic block 1101). This function can be implemented, for example, by using a software attribute when programming a PLD which is similar to "synthesis_off" included in software provided by Cypress Semiconductor Corporation The use of this attribute is redundant and not required to solve the clock skew and metastability problems when the product term clock provided to logic block 1103 at node 1111 is provided by a registered output, for example, from register 202 in FIG. 3, the product term clock is combinatorial in nature and is assigned to I/O signal such as I/O signal 36, 38, 40 or 42, the product term clock is a dedicated input signal, or the functionality of the product term clock consists already of just one product term. It will be appreciated by one skilled in the art that use of an attribute similar to "synthesis_off" is not required to practice the present invention, but may be utilized as part of the present invention to avoid potential metastability issues and data hazards.

Although the present invention has been described in terms of a preferred embodiment, it will be appreciated that various modifications and alterations might be made by those skilled in the art without departing from the spirit and scope of the invention. The invention should therefore be measured in terms of the claims which follow.

We claim:

1. In a programmable device having synchronously clocked registers, a method for generating an asynchronously clocked signal without employing said synchronously clocked registers, said method comprising:

receiving an input signal;

receiving an event signal;

generating an intermediate signal, said intermediate signal having a same signal state as said input signal when said event signal is in a first signal state, said intermediate signal remaining in said same signal state when said event signal is in a second signal state; and producing said asynchronously clocked signal when said intermediate signal is in said same signal state and said event signal transitions from said first signal state to said second signal state, said asynchronously clocked signal remaining unchanged when said event signal transitions from said second signal state to said first signal state.

2. The method of claim 1 wherein said transition edge of said event signal is a rising edge.

3. The method of claim 1 wherein said transition edge of said event signal is a falling edge.

4. The method of claim 1 wherein said event signal is generated within said synchronously clocked programmable device.

5. The method of claim 1 wherein said event signal is generated from a plurality of product terms.

6. The method of claim 1 wherein said event signal is generated from one product term.

7. The method of claim 1 wherein said input signal is generated within said synchronously clocked programmable device.

8. The method of claim 1 wherein said input signal is generated from a plurality of product terms.

9. The method of claim 1 wherein said programmable device includes a plurality of AND gates coupled to a plurality of OR gates.

10. The method of claim 1 wherein said programmable device includes a first plurality of NOR gates coupled to a second plurality of NOR gates.

11. In a programmable device having synchronously clocked registers, a method for generating an asynchronously clocked signal without employing said synchronously clocked registers, said method comprising:

receiving an input signal;

receiving an event signal;

generating a first polarity signal at a first node when said event signal is in a first logic state, said first polarity signal remaining unchanged when said event signal is in a second logic state;

generating said asynchronously clocked signal at a second node in response to a first transition edge of said event signal, said asynchronously clocked signal having a same polarity as said first polarity signal at said first node, said asynchronously clocked signal remaining unchanged in response to a second transition edge of said event signal.

12. In a programmable device having synchronously clocked registers, a circuit for generating an asynchronously clocked signal without employing said synchronously clocked registers, said circuit comprising:

first circuitry operable to receive an input signal and an event signal, said first circuitry generating an intermediate signal having a same signal state as said input signal when said event signal is in a first signal state, said intermediate signal remaining in said same signal state when said event signal is in a second signal state;

second circuitry coupled to said first circuitry and said event signal, said second circuitry operable to receive said intermediate signal, said second circuitry providing said asynchronously clocked signal from said intermediate signal in response to a transition edge of said event signal.

13. The circuit of claim 12 wherein said second circuitry provides said asynchronously clocked signal when said intermediate signal is in said same signal state and said event signal transitions from said first signal state to said second signal state, said asynchronously clocked signal remaining unchanged when said event signal transitions from said second signal state to said first signal state.

14. The circuit of claim 12 wherein said transition edge of said event signal is a rising edge.

15. The circuit of claim 12 wherein said transition edge of said event signal is a falling edge.

16. The circuit of claim 12 wherein said event signal is generated within said synchronously clocked programmable device.

17. The circuit of claim 12 wherein said event signal is generated from a plurality of product terms.

18. The circuit of claim 12 wherein said event signal is generated from one product term.

19. The circuit of claim 12 wherein said input signal is generated within said synchronously clocked programmable device.

20. The circuit of claim 12 wherein said input signal is generated from a plurality of product terms.

21. A programmable logic device comprising:

at least one input;

at least one clock input;

a product term array for generating at least one AND term, said product term array having a first plurality of combinatorial logic gates, said product term array coupled to said at least one input;

a product term allocator for receiving said at least one AND term from said product term array, said product term allocator having a second plurality of combinatorial logic gates, said product term allocator coupled to said product term array; and at least one macrocell having at least one register synchronously clocked by a clock signal received from said at least one clock input, said at least one macrocell coupled to said product term allocator and at least one output;

wherein said first plurality of combinatorial logic gates of said product term is coupled to said second plurality of combinatorial logic gates of said product term allocator such that a signal provided to said product term array is asynchronously clocked through said programmable logic device without utilizing said at least one register synchronously clocked by said clock signal.

22. In a programmable logic device, having no hardware capability to generate an asynchronously clocked signal without utilizing a register element, a method for programming the programmable logic device to generate an asynchronously clocked signal comprising:

receiving an input signal;

receiving an event signal;

generating an intermediate signal, said intermediate signal having a same signal state as said input signal when said event signal is in a first signal state, said intermediate signal remaining in said same signal state when said event signal is in a second signal state; and producing said asynchronously clocked signal when said intermediate signal is in said same signal state and said event signal transitions from said first signal state to said second signal state, said asynchronously clocked signal remaining unchanged when said event signal transitions from said second signal state to said first signal state.

* * * * *